(12) United States Patent
Johnson et al.

(10) Patent No.: US 7,499,614 B2
(45) Date of Patent: Mar. 3, 2009

(54) PASSIVE ALIGNMENT OF VCSELS TO WAVEGUIDES IN OPTO-ELECTRONIC CARDS AND PRINTED CIRCUIT BOARDS

(75) Inventors: Eric A. Johnson, Greene, NY (US); David V. Caletka, Apalachin, NY (US)

(73) Assignee: International Business Machines Corporation, Armonk, NY (US)

(*) Notice: Subject to any disclaimer, the term of this patent is extended or adjusted under 35 U.S.C. 154(b) by 1075 days.

(21) Appl. No.: 10/692,921

(22) Filed: Oct. 24, 2003

(65) Prior Publication Data

US 2005/0089264 A1 Apr. 28, 2005

(51) Int. Cl.
*G02B 6/26* (2006.01)

(52) U.S. Cl. .............................. 385/52; 385/14; 385/15; 385/129; 385/130; 385/132; 385/131; 385/143; 385/145

(58) Field of Classification Search ............... 385/14, 385/129–132, 143, 145, 15, 88, 89, 92, 52
See application file for complete search history.

(56) References Cited

U.S. PATENT DOCUMENTS

| | | | |
|---|---|---|---|
| 4,892,377 A | 1/1990 | Randle | 385/39 |
| 5,420,954 A | 5/1995 | Swirhun et al. | 385/92 |
| 5,499,312 A | 3/1996 | Hahn et al. | 385/91 |
| 5,631,988 A | 5/1997 | Swirhun et al. | 385/89 |
| 5,661,831 A | 8/1997 | Sasaki et al. | 385/49 |
| 5,857,049 A | 1/1999 | Beranek et al. | 385/91 |
| 6,125,043 A | 9/2000 | Hauer et al. | 361/760 |
| 6,164,837 A | 12/2000 | Haake et al. | 385/90 |
| 6,222,967 B1 | 4/2001 | Amano et al. | 385/49 |
| 6,834,133 B1* | 12/2004 | Towle et al. | 385/14 |
| 2002/0084522 A1* | 7/2002 | Yoshizawa et al. | 257/692 |
| 2005/0089264 A1* | 4/2005 | Johnson et al. | 385/15 |
| 2005/0105860 A1* | 5/2005 | Oono et al. | 385/88 |

FOREIGN PATENT DOCUMENTS

| | | |
|---|---|---|
| EP | 1 120 673 A1 | 8/2001 |
| JP | 2000022279 A | 1/2000 |
| JP | 2000056189 A | 2/2000 |

* cited by examiner

*Primary Examiner*—Brian M Healy
(74) *Attorney, Agent, or Firm*—Scully, Scott, Murphy & Presser, P.C.; William H. Steinberg, Esq.

(57) ABSTRACT

A method of producing opto-electronic cards and printed circuit boards which are adapted to provide for passive alignment of VCSELs to waveguides. Also provided are opto-electronic cards and printed circuit boards which incorporate structure providing for the passive alignment of VCSELs to waveguides.

14 Claims, 2 Drawing Sheets

PASSIVE ALIGNMENT OF VCSELS TO WAVEGUIDES IN OPTO-ELECTRONIC CARDS AND PRINTED CIRCUIT BOARDS

BACKGROUND OF THE INVENTION

1. Field of the Invention

The present invention relates to a method of producing opto-electronic cards and printed circuit boards which are adapted to provide for the passive alignment of VCSELs to waveguides. Moreover, the invention relates to opto-electronic cards and printed circuit boards which incorporate structure providing for the passive alignment of VCSELs to waveguides.

Basically, optical waveguides operate with higher ranges of bandwidths than copper circuits which are employed in printed circuit boards, consequently requiring essentially less operating power, while also not being as susceptible to so-called cross-talk which is encountered in such types of printed circuit boards. Ordinarily, in the technology, waveguides have been utilized in connection with transmissions taking place over long distances; however, more recently, as a result of decreasing manufacturing costs and due to the high bandwidths which are achievable with VCSELs (Vertical Cavity Surface Emitting Lasers), such optical waveguides are increasingly employed in LANs (Local Area Networks). These optical waveguides are currently being used to communicate between processor boards, among other applications in industry and commerce.

For instance, the use of commercially available organic multi-mode ribbon waveguides has been demonstrated for a 10-channel bus with 10 Gb data rate, and whereby connection to VCSELs and PINs (opto-electronic photodiodes or devices) are attained through the utilization of micro-machined connectors. These particular types of known multi-mode ribbon waveguides have been successfully laminated onto electronic printed wiring boards (PWBs).

Moreover, opto-electronic printed circuit boards have also been produced by implementing the embossing of a polymer core, in which an optical fiber is attached to VSCELs or PINS and is arranged so as to project downwardly through the printed circuit board to an optical layer located at the center thereof. In effect, the feasibility in the fabrication of waveguides on the surface of printed circuit boards utilizing build-up layers has been demonstrated and proven in the technology, and wherein passive alignment of VSCELs arrays with these waveguides by means of C4-connections (controlled collapse chip connections) has been widely applied.

2. Discussion of the Prior Art

Although the fabrication and methods of providing improved passive alignment schemes between VSCELs and/or PIN arrays or waveguides within electronic build-up layers is basically known in the technology and employed in industry, further improvements thereto are readily contemplatable in order to render the methods and production costs still more economical and efficient.

Amano, et al. U.S. Pat. No. 6,222,967 B1 discloses a packaging for optically coupling one or more optical waveguides of one or more optical elements. This is accomplished utilizing solder for waveguide alignment, as well as employing the surface effects of resins.

Haake, et al. U.S. Pat. No. 6,164,837 is directed to disclosing the effects of mechanical alignment of an optical fiber within an optical package utilizing micro-manipulation and localized heating of solder preforms in order to freeze the precise location of the optical fiber subsequent to completion of the alignment in connection with the optical package.

Hauer, et al. U.S. Pat. No. 6,125,043 discloses a circuit board arrangement having a component mounted thereon through the intermediary of a soldering process and effectuating an automatic passive alignment due to surface tension effects of melted solder.

Beranek, et al. U.S. Pat. No. 5,857,049 discloses an opto-electronic package or module incorporating an opto-electronic device on one plane which is aligned with an optical fiber located on a second plane. Methods of providing the appropriate component alignment are obtained by wetting bond pads, and also through the use of surface tension effects.

Sasaki, et al. U.S. Pat. No. 5,661,831 discloses a self-aligning optical element and an optical waveguide structure with a laser diode array which is solder bonded to a first pad utilizing the surface tension of solder during reflow.

Swirhun, et al. U.S. Pat. Nos. 5,631,988 and 5,420,954 each disclose an optical interconnect which couples multiple fibers to an array of optoelectronic devices. Reliance is placed on alignment pins and components which are aligned with respect to holes by employing lithographically defined solder patterns, and where surface tension is employed for automatically performing the necessary alignments among the various components.

Hahn, et al. U.S. Pat. No. 5,499,3612 discloses a method using flip chip bonding technology for the passive automatic alignment of optical waveguides and photonic devices employing the surface tension phenomena of controlled volumes of material in a liquid form which is positioned on wettable pads.

Randle U.S. Pat. No. 4,89,377 discloses the alignment of an array of optical fibers with optical components, such as waveguides, which are located in a block of insulating material. Disclosed is an array of accurately formed solder pads, containing controlled amounts of solder.

European Patent Publication EP0 1 120 673 A1 discloses an optical package wherein alignment is achieved by positioning a controlled volume of suitable material in liquid form and employing surface tension effects in order to provide for the necessary alignment, with the provision of the required photonic elements, such as SEL lasers and optical waveguides.

Japanese Patent Publication 2000-56189 discloses an improvement in positional alignment of an optical component relative to an optical fiber, wherein the alignment is effected by the surface tension effects of solder bumps. Similarly, Japanese patent publication 2000-22279 discloses an optical element structure in which optical elements and light transmitting paths can be accurately aligned through the arrangement of solder relative to a metal pad and employing tension effects.

Japanese Patent Publication 08-179154 discloses the alignment of an optical waveguide structure which is formed on a substrate with a laser diode array utilizing the surface tension effects of solder during reflow.

Finally, Japanese patent publication 01-140104 discloses the alignment of an array of optical fibers with optical components, such as waveguides, in a block of insulating material, wherein there is provided an array of accurately formed solder pads, and containing controlled amounts of solder.

Although the foregoing publications to various extent collectively disclose alignments between components of opto-electronic devices or modules of the type described herein, none of these provide for nor suggest the improved method and structure concerning the passive alignment of waveguides as set forth by the present invention.

SUMMARY OF THE INVENTION

Accordingly, in order to obviate or ameliorate any drawbacks encountered in the prior art, the present invention is directed to the obtaining of an improved passive alignment between VCSELs or PIN arrays and waveguides within electronic built-up layers of opto-electronic packages. Moreover, the thermal stability of the applicable opto-electronic card or printed circuit board (PCB) may be considerably improved through the employment of a core constituted of a low expansion material mounting the optical components and a first built-up layer, as a consequence of which the accommodation of larger VCSELs and PIN arrays, as well as the use of smaller waveguide dimensions can be readily rendered possible so as to enhance the versatility and economic efficacy of the present invention.

Basically, a precise and passive alignment of VCSELs and receiver chips relative to the opto-electronic card (or printed circuit board) may be attained by means of a C4 solder reflow. Thus, it is well known in the technology that the surface tension of molten solder aligns the chips to the solder pads on the card or printed circuit board. In the current prior art, for opto-electronic cards or printed circuit boards, the C4s are so-called "pad-defined", and are generally located on different wiring layers than the waveguide. As a result of this type of arrangement, tolerances accumulate through the various manufacturing steps so as to collectively cause misalignment among the various components, which may adversely affect the reliability and service life of the entire electronic package.

Pursuant to one aspect of the invention, the extent of precision of alignment between the VCSEL, the PIN arrays and the mirrors of the waveguide may be readily controlled by simultaneously etching a second cladding or organic layer located on a core or substrate so as to form the waveguide channels and the C4 openings. The C4 openings expose a portion of each pad which is to be electrically connected to the transmitter or receiver chips, in view of which the exact position of the C4s is determined not by the pad but rather by the opening in the second cladding or organic layer printed on the surface of the core. This may be termed a so-called "mask-defined" C4 in its differentiation from a "pad-defined" C4 where the solder joint wets the entire pad. The foregoing may be followed by plating the electronic circuits, filling the channels with waveguide material, and then adding the upper cladding or organic layer. Inasmuch as the mirrors in the waveguide channel and the openings leading to the C4 pads are formed simultaneously, they can be positioned in an extremely precise relationship relative to each other, and at very low and acceptable tolerances.

Accordingly, it is an object of the present invention to provide a method of producing opto-electronic cards and printed circuit boards which are adapted to provide for the passive alignment of VCSELs to waveguides.

Another object of the present invention is to provide opto-electronic cards and printed circuit boards which incorporates structure providing for the passive alignment of VCSELs to waveguides pursuant to the method of the present invention.

BRIEF DESCRIPTION OF THE DRAWINGS

Reference may now be made to the following detailed description of preferred embodiments of the invention, illustrating generally diagrammatically, fragmentary sectional view thereof, wherein.

DETAILED DESCRIPTION OF THE PREFERRED EMBODIMENTS

Figure 1:
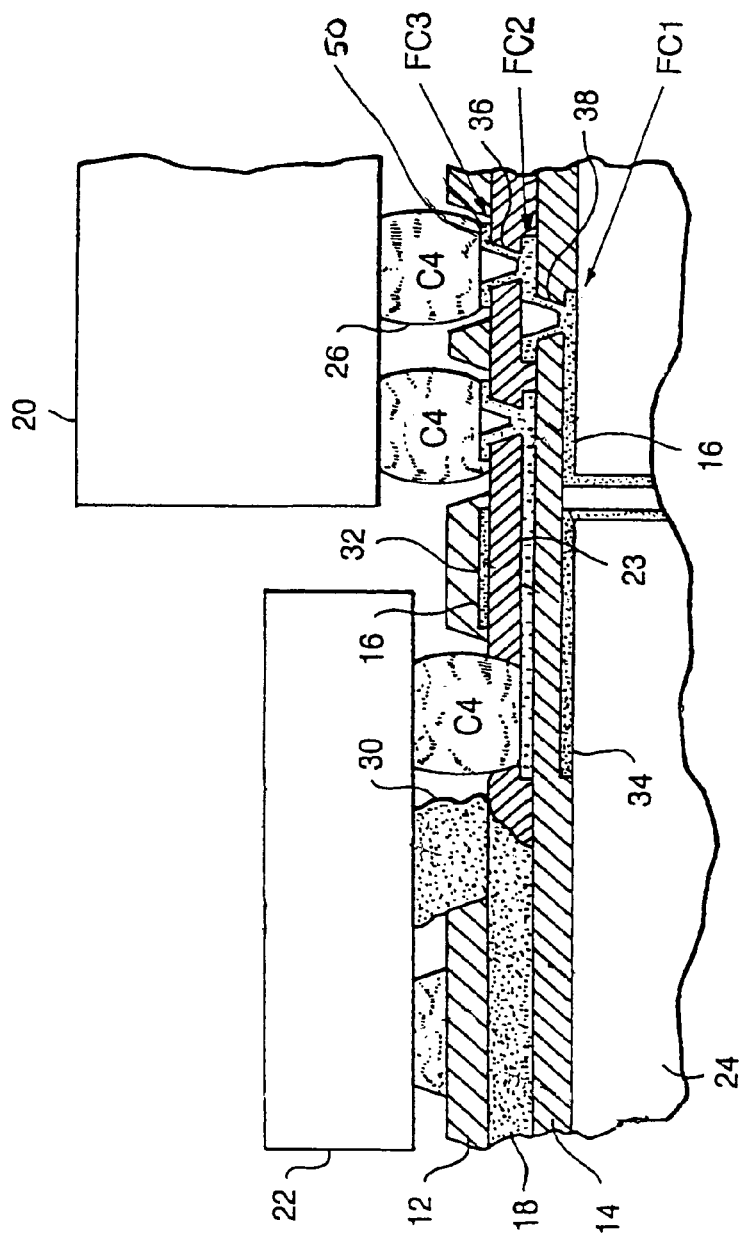
FIG. 1 illustrates, in a sectional view, discrete chips which mounted on a card with waveguide and two built-up layers for circuitry, constructed pursuant to the invention.

Referring specifically to FIG. 1 of the drawings, there is illustrated a sectional view of a portion of an inventive structure with two built-up cladding layers 12, 14 for wiring 16 and discrete transmitter/receiver waveguide 18 in an intermediate layer, including a signal plane 23, and processor chips 20; and an optical device 22. Additional wiring layers can be added above the upper cladding layer 12, however, thermal stability and electrical performance are at their optimum with the present structure.

The foregoing structural configuration eliminates the need for a solder mask inasmuch as the upper cladding layer 12 can readily serve for this purpose. The core 24 can be comprised of any low expansion material which approaches the coefficient of thermal expansion (CTE) of the chips 20, thereby further improving alignment and minimizing any encountered strain in the C4 joints 26. Hereby, standard epoxy glass composites can be employed for the core, consisting of cloth utilizing thick yarns and low expansion S-glass with minimal epoxy can possess CTEs as low as 10 ppm/° C.

Furthermore, employing an index-matched adhesive material 30 can improve the optical performance of the illustrated structure, by coupling the upper cladding layer 12 directly to the transmitter/receiver chips 20. In that instance, it is necessary to use the index-matched adhesive 30 between the optical component 22 and the waveguides since underfill materials are normally highly filled with silicon or other particles which would ordinarily scatter a light. The uncured adhesive 30 can be at least partially cured during the C4 reflow process. Cladding is the standard terminology used in optical waveguides for the material that surrounds the waveguide's core. The RI mismatch with the core prevents light from escaping from the waveguide. This is well-known. Glass is used for the waveguide and cladding materials in traditional optical fibers.

Polymers with good transmissibility, such as polycarbonates, are good for use as waveguides and cladding. Since these are not electrically conductive, they are also dielectric materials. The description of how these polymeric layers are built up into a waveguide is given above.

A horizontal optical path can be formed by roll laminating a photoimageable polymer on a surface of fr4, etc. this is accomplished with heat and pressure. The next stop is exposing the material with UV light that is passed through a glass mask or mylar mask image. The panel is then developed with wet chemistry to strip away the photoimageable material where an optical path is required. The "trench" formed is then filled with an optically transparent polymer with a pressurized head that also has blades that move laterally across the outer surface of the photoimageable polymer, filling the trench with a squeegee like apparatus.

A vertical path can be formed by several methods. One way to form it for thin layers <0.004" thick is the above process. Deeper "holes" can be formed by drilling or lasing. The optically transparent material is filled by the same apparatus as above.

Figure 2:
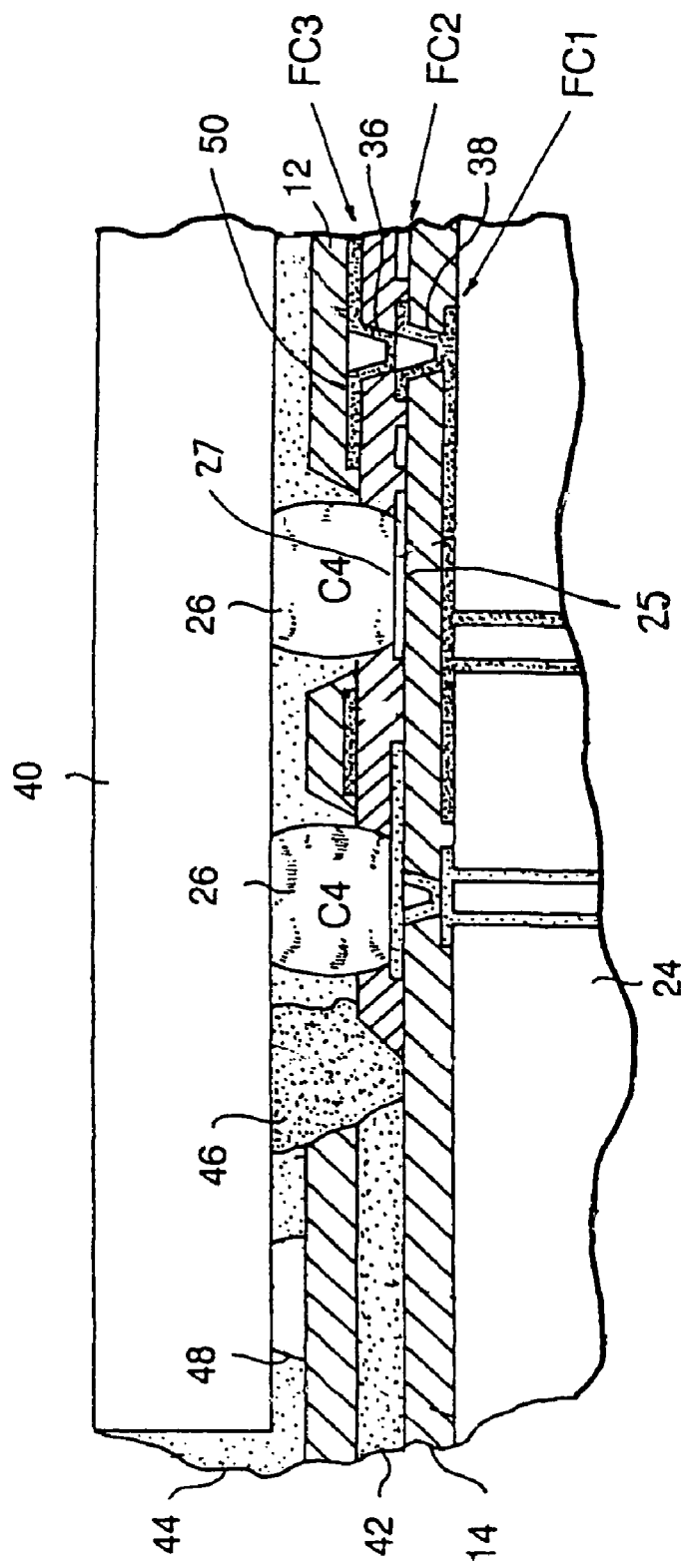
FIG. 2 illustrates a second embodiment which is similar to FIG. 1, comprising a single integrated chip mounted on a card with waveguide and two built-up layers for circuitry.

The waveguide and cladding materials are both polymers and are dielectric materials. The principal requirements for these materials are good transmissibility or stated another way, a low loss of light at the frequency emitted by the VCSELs and the correct relationship of refractive indices. The dielectric constant is of secondary importance as it will affect the propagation speed of the electrical signals. The core of the circuit board can be provided with traces for carrying signal or ground formed on the surface thereof by any of the many well-known additive or subtractive processes. The first cladding layer 14 is applied as either a wet process or a dry film. Vias may be formed, for example, by exposing and etching a photosensitive layer or by laser ablation, whereby laser ablation is preferred since it requires fewer processing steps. Vias 38 and signal traces 23 may now be added by plating. A second cladding layer (not numbered in the drawings but coplanar with waveguide 18) may now be added using wet or dry process. In an essential aspect, channels for the waveguide 18 and openings for the C4s of the optical device 22 or integrated chip 40, are now formed simultaneously, imparting a precise control over the position of the C4s relative to the waveguide. The mirror surface at 45° is formed when the channel is etched or ablated. In FIG. 1, an opening for a C4 is provided where the second C4 from the left is joined to a large pad on the wiring layer 23. It is noted that the left-hand C4 is similarly attached to a pad, however, in this cut-away or sectional view, it is obscured by the waveguide 18 and upper cladding layer 12. FIG. 2 is similar in that there is provided a signal plane 25, and illustrating the large pad 27 on which the C4 is seated. Wiring on the FC3 level 32 (not indicated in FIG. 2) can be added at this point and the mirror may be plated. Alternatively, this wiring may be added after the waveguide material has filled the waveguide channel as described next. After the channel for the waveguide has been formed, it is filled with the waveguide material, this being most easily done using a wet process so that the channel is completely filled. A dry film would not completely fill the channel, which would ordinarily have a nearly rectangular cross-section. The upper cladding layer 12 is thereafter applied, and openings must be made using etching or ablation to provide an optical path to the waveguide mirror 50 and the C4 pads for the optical device 22 or the integrated chip 40. Chips 20, 40 and optical device 22 can be attached using the C4 reflow process, as is well known in the technology.

Signals may be transmitted to the VCSEL array, or from an array of receivers on the signal plane 23 on cladding layer 14, allowing ground planes 32, 34 to be present both above and below for good impedance control. The signal path is relatively short, inasmuch as wire bonding is not employed herein, and the ASIC, memory and other chips on the card or printed circuit board can be electrically connected to other wiring layers.

Although the vias 36, 38 which are formed in the structure are shown as being offset in drawing FIG. 1, these vias may be stacked in vertical alignment relative to each other, in order to improve wireability as shown hereinbelow in FIG. 2, wherein similar components with those in FIG. 1 are designated by the same reference numerals.

Whereas it is currently deemed uneconomical to be able to combine optical devices 22 such as VCSELs with serialized electronics, ASICs or memory chips 40, such a device may be easily packaged as described hereinabove, and as shown in FIG. 2 of the drawings. With the illustrated optical waveguide 42, the number of electrical I/Os is greatly reduced and the entire chip 40 may be electrically connected to the second wiring layer or the transmitting-receiving plane, leaving the ground layer for shielding. Such integrated chips 40 are more likely to require underfill 44 in order to obtain a satisfactory life expectancy for the C4 joint 26.

An alternate aspect of the invention resides in applying an index matched adhesive 46 between the transmitter/receiver chip 40 and the waveguide 42, as shown in the drawing, whereby in that instance, mirrors 50 are formed after the waveguide material has been applied. This structure would then be compatible with an alternative manufacturing process whereby the waveguide material is applied as a layer above the lower cladding layer 14, then exposed and the unexposed material can thereafter be removed. A metal cladding layer 48 is then applied and the critical features, such as the mirrors 50 and vias 36, 38 are etched, whereas finally the upper cladding layer 12 is applied and etched at locations, wherever necessary for the intended applications.

A mirror is formed whenever two materials with different refractive indices are joined. Simply providing a 45° surface, as shown in FIGS. 1 and 2, will create a mirror since the cladding material and the waveguide material have different indices. Such a mirror will be only partially reflecting, and in order to improve thereon, the surface could be coated with chrome, for example, by sputtering through a mask. Alternatively, Cr sputter can be employed, and with laser ablation where the Cr is not required. The 45° surface can be laser ablated in the middle cladding layer when the waveguide channels are formed.

Alternatively, the mirror is formed in the photoimageable layer by using a "grey scale". The trench is formed by a black feature in the mask that when developed, the wet chemistry removes all the photoimageable material all the way down. The mirror bottom starts black on the mask and progressively is lighter until it is clear, indicating the outer surface of the photoimageable polymer. In order to obtain a 45° angle, for example, with a 0.004" thick photoimageable polymer, the mask would go from black to clear in 0.004" on the end of the "trench".

From the foregoing, the method of producing either an optoelectronic card or printed circuit board through the intermediary of concurrently or simultaneously producing the card alignment, and by simultaneously etching the cladding layer to form waveguide channels and C4 joint openings, increases the accuracy in alignment among the various layers and components in an inexpensive and highly effective manner, thereby rendering the entire method highly receptive to and compatible with industry demands while significantly lowering costs of production.

While the invention has been particularly shown and described with respect to preferred embodiments thereof, it will be understood by those skilled in the art that the foregoing and other changes in form and details may be made therein without departing from the spirit and scope of the invention.

What is claimed is:

1. An opto-electronic package facilitating the passive alignment of VCSELs to waveguides; said package comprising:
   a substrate bearing a first surface;
   a first cladding layer positioned on said first surface of said substrate;
   a contact pad positioned on at least a position of the surface of said first cladding layer;
   a second cladding layer located on a further surface position of said first cladding layer;
   a waveguide channel being positioned in said second cladding layer, said first and second cladding layers each being constituted of an organic material;

optical means being in optical communication with said waveguide channel in said second cladding layer and in electrical connection with said contact pad on said first cladding layer, at least one transmitter/receiver chip being coupled to said surface of said second cladding layer; and at least one transmitter/receiver chip being coupled to said surface of said second cladding layer through the interposition of C4-joints.

2. An opto-electronic package as claimed in claim 1, wherein said substrate comprises a low expansion material approaching the coefficient of thermal expansion of the at least one chip so as to reduce and minimize strains encountered in the C4-joints.

3. An opto-electronic package as claimed in claim 2, wherein said substrate material is selected from the group of materials consisting of epoxy glass composites, utilizing thick yarns and low expansion s-glass with a CTE of as low as 10 ppm/° C.

4. An opto-electronic package as claimed in claim 2, wherein an index-matched adhesive couples said second cladding layer directly to said at least one transmitter/receiver chip, and extends between said optical means and waveguide channel.

5. An opto-electronic package as claimed in claim 1, wherein said second cladding layer has an integrated chip with optical inputs and outputs mounted on the surface of said cladding layer.

6. An opto-electronic package as claimed in claim 1, wherein said package comprises a constituent of a printed circuit board providing for the precise alignment of VCSELs to waveguides.

7. An opto-electronic package as claimed in claim 1, wherein said package comprises a constituent of an opto-electronic card providing for the passive alignment of VCSELs to waveguides.

8. A method of producing an opto-electronic package facilitating the passive alignment of VCSELs to waveguides; said method comprising:

providing a substrate having a first surface;

positioning a first cladding layer on said first surface of said substrate;

arranging a contact pad on at least a portion of the surface of said first cladding layer;

locating a second cladding layer on a further surface portion of said first cladding layer;

positioning a waveguide channel in said second cladding layer, said first and second cladding layers each being constituted of an organic material;

providing optical means in optical communication with said waveguide channel in said second cladding layer and in electrical connection with said contact pad on said first cladding layer, at least one transmitter/receiver chip being coupled to said surface of said second cladding layer; and at least one transmitter/receiver chip is coupled to said surface of said second cladding layer through the interposition of C4-joints.

9. A method as claimed in claim 8, wherein said substrate comprises a low expansion material approaching the coefficient of thermal expansion of the at least one chip so as to reduce and minimize strains encountered in the C4 joints.

10. A method as claimed in claim 9, wherein said core material is selected from the group of materials consisting of epoxy glass composites, utilizing thick yarns and low expansion S-glass with a CTE of as low as 10 ppm/° C.

11. A method as claimed in claim 9, wherein an index-matched adhesive couples said second cladding layer directly to said at least one transmitter/receiver chip, and extends between said optical means and waveguide channel.

12. A method as claimed in claim 8, wherein an integrated chip with optical inputs and outputs is mounted on the surface of said second cladding layer.

13. A method as claimed in claim 8, wherein said package comprises a constituent of a printed circuit board providing for the precise alignment of VCSELs to waveguides.

14. A method as claimed in claim 8, wherein said package comprises a constituent of an opto-electronic card providing for the passive alignment of VCSELs to waveguides.

* * * * *